(12) United States Patent
Bailly et al.

(10) Patent No.: US 9,031,964 B2
(45) Date of Patent: May 12, 2015

(54) SHARED GEO-LOCATED OBJECTS

(75) Inventors: Olivier Bailly, Oakland, CA (US);
Francois Bailly, Santa Clara, CA (US);
Adam Smith, San Francisco, CA (US);
Mark Limber, Boulder, CO (US);
Michael W. Springer, Aurora, CO (US)

(73) Assignee: Google Inc., Mountain View, CA (US)

( * ) Notice: Subject to any disclaimer, the term of this patent is extended or adjusted under 35 U.S.C. 154(b) by 1787 days.

(21) Appl. No.: 11/740,222

(22) Filed: Apr. 25, 2007

(65) Prior Publication Data

US 2007/0249368 A1 Oct. 25, 2007

Related U.S. Application Data

(60) Provisional application No. 60/794,875, filed on Apr. 25, 2006.

(51) Int. Cl.
*G06F 7/00* (2006.01)
*G06F 17/30* (2006.01)

(52) U.S. Cl.
CPC ...... *G06F 17/30241* (2013.01); *G06F 17/3087* (2013.01)

(58) Field of Classification Search
None
See application file for complete search history.

(56) References Cited

U.S. PATENT DOCUMENTS

| | | | |
|---|---|---|---|
| 7,298,378 B1 * | 11/2007 | Hagenbuch et al. | 345/589 |
| 7,457,706 B2 * | 11/2008 | Melero et al. | 702/5 |
| 2002/0032546 A1 | 3/2002 | Imamura et al. | |
| 2003/0061211 A1 | 3/2003 | Shultz et al. | |
| 2003/0088362 A1 | 5/2003 | Melero et al. | |
| 2003/0120654 A1 | 6/2003 | Edlund et al. | |
| 2005/0055337 A1 | 3/2005 | Bebo et al. | |
| 2005/0209831 A1 | 9/2005 | Jungreis et al. | |
| 2006/0075442 A1 | 4/2006 | Meadow | |
| 2006/0190312 A1 | 8/2006 | Onuma et al. | |
| 2006/0238383 A1 | 10/2006 | Kimchi et al. | |
| 2007/0070069 A1 | 3/2007 | Samarasekera et al. | |
| 2007/0083329 A1 * | 4/2007 | Im | 702/5 |
| 2007/0233367 A1 * | 10/2007 | Chen et al. | 701/207 |

(Continued)

FOREIGN PATENT DOCUMENTS

| | | |
|---|---|---|
| EP | 1 184 792 A2 | 3/2002 |
| WO | 97/07467 A1 | 2/1997 |
| WO | 00/49530 A1 | 8/2000 |
| WO | 01/65518 A2 | 9/2001 |

OTHER PUBLICATIONS

Waterman Foss E: "Yellow Pages on CD-Rom: A Survey of Three Contemporary Products", *CD Rom Professional*, vol. 6, No. 5, Sep. 1993, pp. 62, 64. 66-69, XP002064842 ISSN: 1049-0833.

(Continued)

*Primary Examiner* — Rehana Perveen
*Assistant Examiner* — Raheem Hoffler
(74) *Attorney, Agent, or Firm* — Dority & Manning, P.A.

(57) ABSTRACT

A method of reviewing geo-coded information at a geographic information system. The method may include receiving information identifying a geo-located object from a submitter of the object, receiving information identifying the location of the geo-located object from the submitter, and receiving a request from a user of the geographic information system for one or more geo-located objects that includes the submitted geo-located object, and transmitting information for permitting display of the geo-located object to the user of the geographic information system.

6 Claims, 5 Drawing Sheets

(56) References Cited

U.S. PATENT DOCUMENTS

2007/0242131 A1* 10/2007 Sanz-Pastor et al. ...... 348/14.02
2008/0200161 A1* 8/2008 Morse et al. .................. 455/418

OTHER PUBLICATIONS

Desmarais N: "Gold Turns to Silver: Yellow Pages on CD-Rom", *CD Rom Librarian*, Westport, CT, US, vol. 7,. No. 3, Mar. 1992, pp. 21-27, XP002064841.

Notification of Transmittal of International Search Report and Written Opinion in PCT/US2007/067441, mailed May 9, 2008, 17 pages.

Non-Final Office Action in U.S. Appl. No. 11/740,221 mailed on Jul. 28, 2009, 24 pages.

Final Office Action in U.S. Appl. No. 11/740,221, mailed Apr. 14, 2010, 26 pages.

Non-Final Office Action in U.S. Appl. No. 11/740,221, mailed Jan. 9, 2012, 26 pages.

Final Office Action in U.S. Appl. No. 11/740,221, mailed Sep. 12, 2012, 29 pages.

Non-Final Office Action in U.S. Appl. No. 11/740,221, mailed Feb. 14, 2014, 19 pages.

* cited by examiner

SHARED GEO-LOCATED OBJECTS

CROSS REFERENCE TO RELATED APPLICATIONS

This application claims priority under 35 USC §119(e) to U.S. Patent Application Ser. No. 60/794,875, filed on Apr. 25, 2006, the entire contents of which are hereby incorporated by reference.

TECHNICAL FIELD

This invention relates to data storage in distributed systems, and more particularly to databases for geographic information systems.

BACKGROUND

Geographic information systems (GIS) permit for the archiving, retrieving, and manipulation of data that has been stored and indexed according to the geographic coordinates of its elements.

GIS systems can provide very helpful information to users, such as by presenting information graphically—see Google Maps and Google Earth as two prime examples of such helpful systems. GIS systems often are navigated by entering particular longitude/latitude coordinates, or by entering addresses, such as street addresses, which may be resolved to a particular coordinate before querying a database for geo-specific information such as maps or satellite images. The information returned may be information that is provided by "official" sources, such as government or industry imagery or demographic data, or information such as the locations of businesses and residences.

SUMMARY

This document describes systems and methods for storing and accessing geo-located content, such as 3D content to be displayed on a model of the earth. In general, users of a system may identify objects to be placed in a geography to a system. These objects may include, for example, 3D models of buildings and other structures—whether current, planned, or fictional. The system may store the objects or may simply store information pointing to the objects. The same or other users may then navigate to certain locations in the geography, or may select particular objects or classes of objects. Information pertaining to the objects may then be shown in a display that also shows the geography, and the information about the objects may, for example, be overlaid over the geography in the locations of the objects.

In response to a selection by the viewing user, such as selecting a labeled hyperlink, the system may return additional information about the object. For example, the system may return an image of the object for the user to preview. The system may also present non-graphical information about the object, such as by opening a separate browser window to display data, e.g., data about earthquakes in certain areas of a geography. Alternatively, the system may point the user's application at the object itself. Where the object is a 3D model, information encoding the object may then be passed to the user's application, which may then render the object on the geography, for interaction with the user.

In one implementation, a method of reviewing geo-coded information at a geographic information system is disclosed. The method may receiving information identifying a geo-located object from a submitter of the object, receiving information identifying the location of the geo-located object from the submitter, receiving a request from a user of the geographic information system for one or more geo-located objects that includes the submitted geo-located object, and transmitting information for permitting display of the geo-located object to the user of the geographic information system.

The described systems and methods may provide for one or more of the following features and/or advantages. Users of a system may benefit by being able to locate, preview, display, and interact easily with objects in a geography such as that displayed by Google Earth. Producers of objects may easily associate their objects with a geography and thereby publish their works so that others may access them. For example, architects may construct models of buildings and make them available to clients through an application such as Google Earth. Geographic information providers may benefit by drawing additional users to their applications, and may thereby increase the revenue they can generate with such applications.

The details of one or more embodiments are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
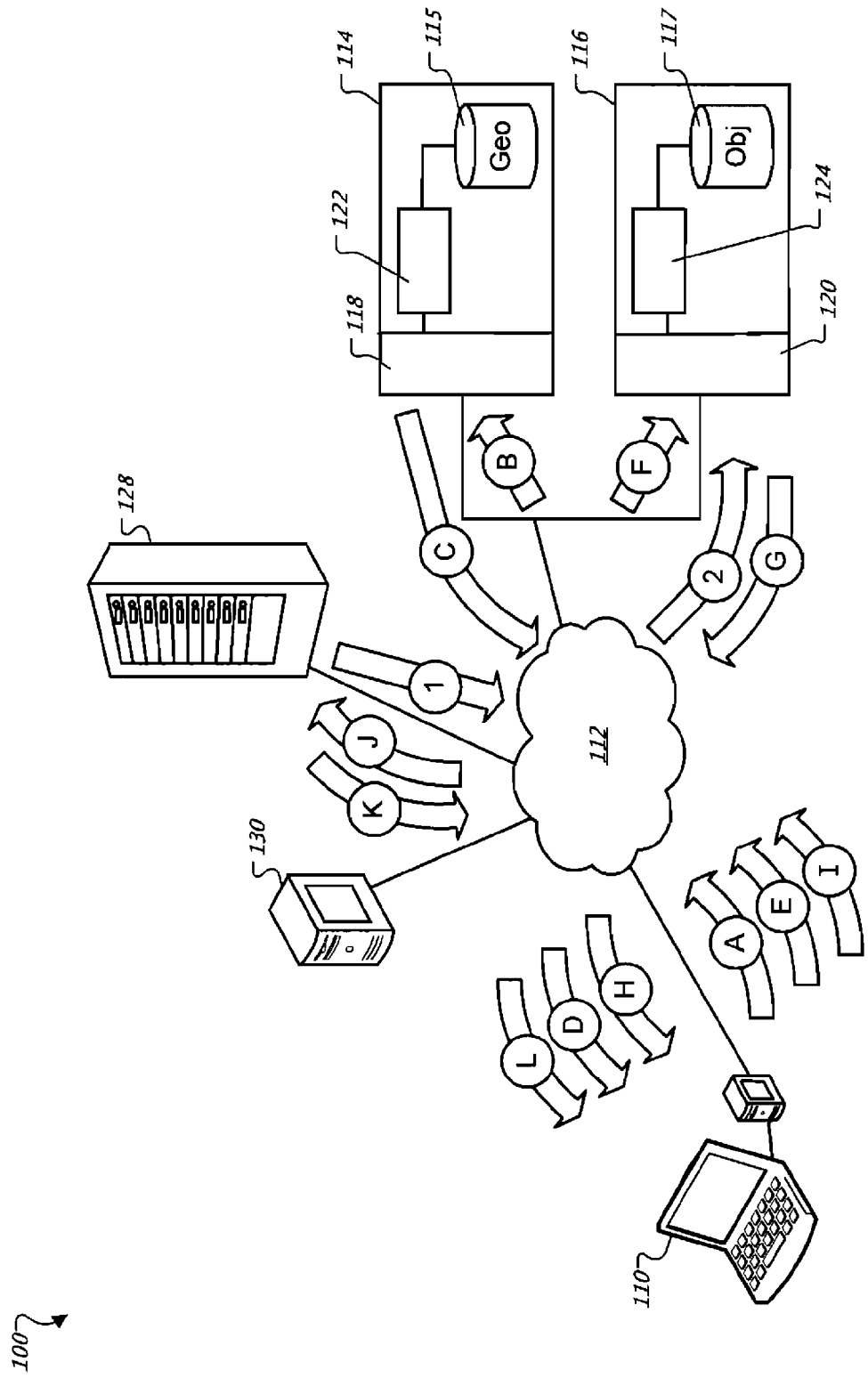
FIG. 1 is a schematic diagram of a system for providing users with objects in a geographic information system.

FIG. 1 is a schematic diagram of a system 100 for providing users with objects in a geographic information system. In general, the system 100 uses a geography server 114 to generate views of a geographic area on an application running on terminal 110—such as a web browser (with or without a plug-in directed to the geographic display) or other application (such as Google Earth). The system 100 may also in cooperation use an object server 116 to deliver information concerning objects associated with the geography. Such objects may include 3D models of building, bridges, or other structures, and may also include geographic data such as earthquake data, weather data, or the like. The coordinated use of the servers 114, 116 may allow objects to be layered over the top of geography so that users may more readily review such objects in a natural manner, and may also interact with the objects in helpful manners.

The various components of the system 100 may communicate through network 112, which may include one or more local area networks (LANs), wide area networks (WANs), the internet, or other appropriate networking structures. The particular arrangement of network 112 is not critical.

Geography server 114 may store a geographic model in geography database 115, and may use a mapping module 122 to receive and respond to user requests through an interface 118. The interface 118 may be, or be part of, a web server or other similar structure or structures. The geography database 115 may include one or more database that contain information showing geographic information, such as a map, satellite images, or visual terrain (e.g., satellite images applied to topography).

The mapping module 122 may receive requests from users, such as a user at terminal 110 through interface 118, and may determine what information in geography database 115 the user needs. For example, the interface 118 may pass certain location information, such as an identifier of a latitude and longitude at which the user has located his or her application, along with information that permits the determination of a bounding box for the area viewed by the user. The mapping module 122 may then query geography database 115 to obtain data for the area inside the bounding box or other defined area. The mapping module 122 may then pass the information to terminal 110, such as in the form of tiled geographic information around the area the user is viewing, or in another appropriate format.

The object server 116 may contain an object database 117 that stores information about various objects that may be associated with particular areas in a geography. The object database 117 may store, for example, a geographic location identifier for each object so that it may be located within, and overlaid on, a representation of the geography. The database 117 may also store information about the object that may be displayed in a geographic representation on terminal 110, including in the form of hyperlinks to additional information. For example, the database 117 may include a label, such as "Eiffel Tower models" that may be displayed over a map of Paris. When a user selects the label, which may be in the form of a hyperlink, the user may be presented with one or more images showing various 3D models of the Eiffel Tower, such as in a pop-up window. (The models may be ordered in various manners, such as by placing most popular models near the top or placing models from certain "trusted" object builders at the top.) The user may select one of the models, such as by selecting one of the images, and the model may be added to the geography displayed on terminal 110.

Object selection engine 124 may operate through interface 120 to identify objects to be displayed on terminal 110. Interface 120 may again be a web server or servers, or may be part of a web server or other appropriate structure. Object server 116 may receive the same commands as does geography server 114, and may, in parallel with geography server 114, obtain information about objects to be sent to terminal 110. The object selection engine 124 may, for example, receive information about a location (including information about a boundary for the location, or information that permits the boundary to be determined), and may query object database 117 to find appropriate objects in the area. The objects may be classified into particular groups, such as types of buildings, weather information, etc., and subsets of database 117 may be searched based on particular groups selected by a user of terminal 110.

Object information obtained from object database 117 may be provided in a variety of forms, including via extensible mark-up language (XML) or an XML extension known as Keyhole Mark-up Language (KML). KML is an XML grammar and file format for modeling and storing geographic features for display in the Google Earth Client application. Particular definitions for version 2.0 of KML are shown in the attached Appendix A.

Labeled arrows that are layered over the components of system 100 show an exemplary flow of information in the system 100. Arrow 1 from rack server 128 shows the submission of information about a particular object to system 100. Rack server 128 represents, for example, a commercial object generator, such as an architectural firm or other such firm. Such an object generator might also produce objects, such as 3D building models, so as to be able to place advertising on the buildings and thereby generate revenue from users who view such objects.

Server 130 may also submit objects to system 100. Server 130 represents, for example, smaller object providers. As one example, a user of a computer may generate an object using an application such as SketchUp, AutoCAD, or 3DStudio, and may submit the object to system 100 for display as part of a geographic information system. In one implementation, the user may visit a web site associated with system 100, and provide information about the object. For example, the user of server 130 may provide a URL where the object may be accessed, such as when other users later choose to incorporate the object into geographies they are viewing. In addition, the user may provide additional information, such as an exemplary image of the object, and other information about the object (e.g., labels for hyperlinks associated with the object). Rack server 128 may provide similar information when submitting an object, and may do so via an interactive web form, or via another application programming interface.

Information about objects submitted to system 100 may be received by object server 116, which may parse such submissions and store the relevant information in object database 117. The information may include a geographic identifier for the object, so that the object may be readily identified later when a user at client 110 is viewing geography, and requests to see objects associated with that geography.

The lettered flow arrows show actions that may occur when a user at terminal 110 begins looking at information in a geographic information system. At arrow A, the user navigates to a particular area of geography, so that a request for visual information about that area is sent through network, as further indicated by Arrow B, to geography server 114. The message may also be routed to object server 116, if the user has selected to have displayed any categories of objects associated with the geography. Geography server 114 determines what information is needed to provide interaction for the user with the particular area, and returns that information via Arrow C and Arrow D. The terminal 110 may then begin constructing a view of the area as the information is downloaded.

At Arrow E, the user may select to view additional information about an object displayed in the area of geography. For example, the user may see a link representing a model of a monument (or group of monuments), and may elect to see the model or models. As one example, a user at rack server 128 may have modeled the monuments on and around the National Mall in Washington D.C., and the terminal 110 may show a link to such models. The user at terminal 110 may select a link displayed over a geographic representation of the Mall (e.g., a map or satellite photo) to obtain more information about the models.

Arrow F shows the user's request being received by object server 116. The request may be formed, for example, in the form of an HTTP request or an XML message. An identifier for the object may be parsed out of the request by server 116, for example, and submitted to object database 117 as a query. The database 117 may then return information, such as an image of the models, which may be returned to terminal 110 via Arrow G and Arrow H.

If the user of terminal 110 likes the models shown in the image, he or she may select to receive the full models. That selection may occur, for example, by clicking on the image. Such an action may cause a message to be delivered to rack server 128 via Arrow I and Arrow J, and rack server may respond by sending information needed to display the model or models via Arrow K and Arrow L.

Figure 2:
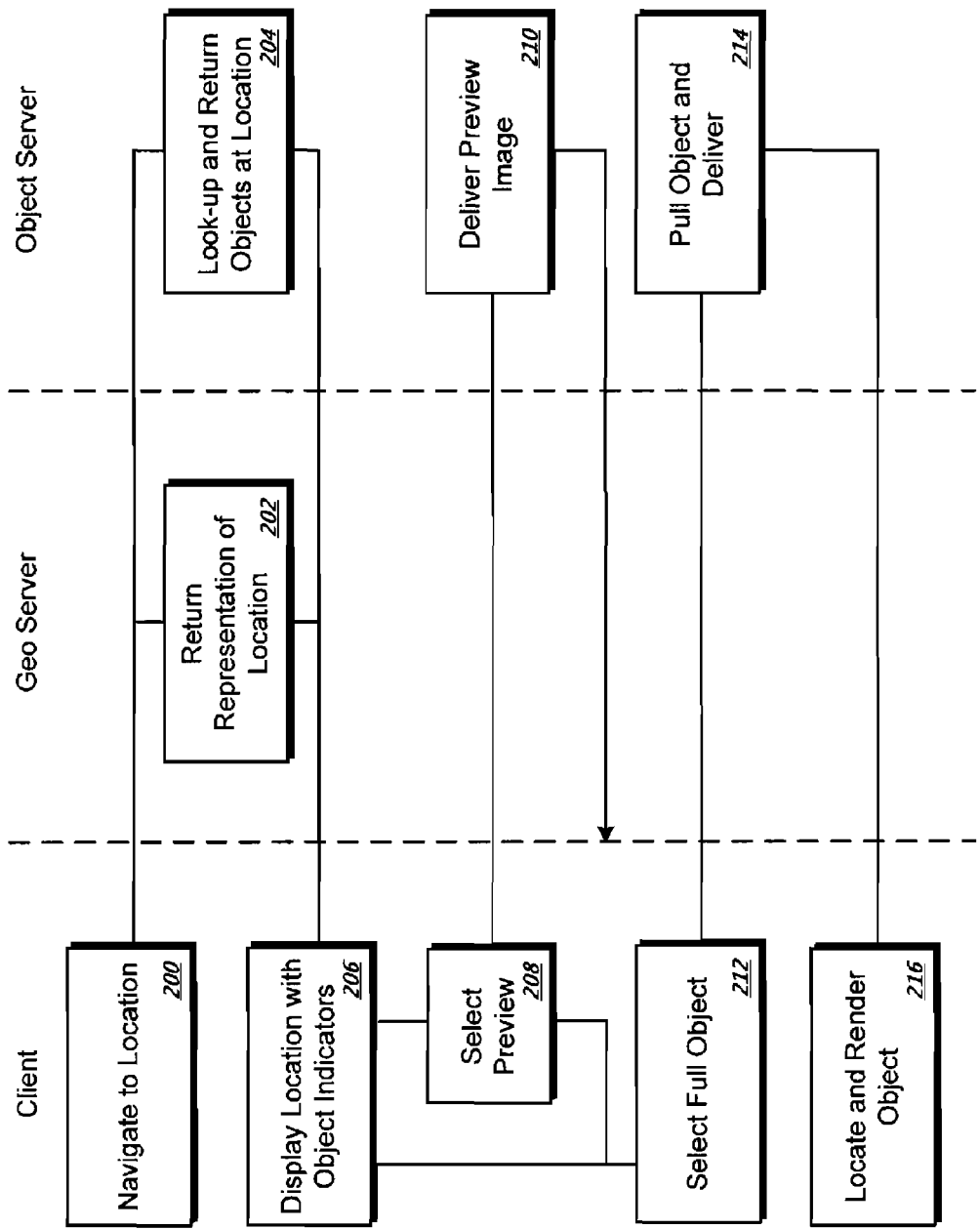
FIG. 2 is a swim-lane diagram of actions that may be taken to provide a user with information about objects associate with a geography.

FIG. 2 is a swim-lane diagram of actions that may be taken to provide a user with information about objects associate with a geography. At act 200, a user of a client device navigates to a geographic location, such as by entering a lat/long combination or an address, or by moving a graphical representation of the geographic area into view on a display. Messages are sent to a geography server and an object server, and may define the currect viewport for the application running on the user's terminal. The message may take the form, for example, of a query parameter that identifies a viewport showing a particular geographic area. In one example, if a user is viewing the city of San Francisco, the message may take the form of:

Bbox=37.9%2C37.7%2C-122.2%2C-122.4

The geography server returns a representation of the location, such as by obtaining satellite or map tiles for the area and for a geography a set distance around the area (act 202). The object server uses geographic information received from the client to look-up and return objects that may be in the requested area/location (act 204).

The information returned by the object server may be, as noted above, textual or image information, along with hyperlink information relating to architectural or other objects in the geographic area. The information may be transmitted, as indicated above, in a KML document, which may contain, for each object or model:

A placemark that pin-points the location of the model on the earth;

A link to a preview image of a thumbnail of the model; and

Links to allow a user to download the model, such as in applications like Google Earth and Google SketchUp or other display and editing applications.

At act 206, the client displays the geographic information at the particular locations, along with object indicators, such as hyperlinks. The indicators may be displayed, for example, overlaid on the geographic information, or to the side of the geographic information, such as in a list of objects relevant to the display. A user at the client may then select an object indicator 208, such as an indicator for a preview image of an object (act 208). This selection may cause the object server (or another appropriate structure) to deliver a preview image to the client (act 210).

The user at the client may then select to view more complete information about an object (act 212), such as information needed to define a full 3D model. Such selection may occur, for example, by selecting an image of the model having a hyperlink associated with it. The link may send a message to the object server, or to another server that requests information about the model or models. The server may then retrieve information about the model or models and transmit it back to the client (act 214).

Upon receiving the information, the client may use the information to locate and render the object for visual review by a user (act 216). For example, the client may render the object as a 3D item on top of a representation of the earth.

Figure 3:
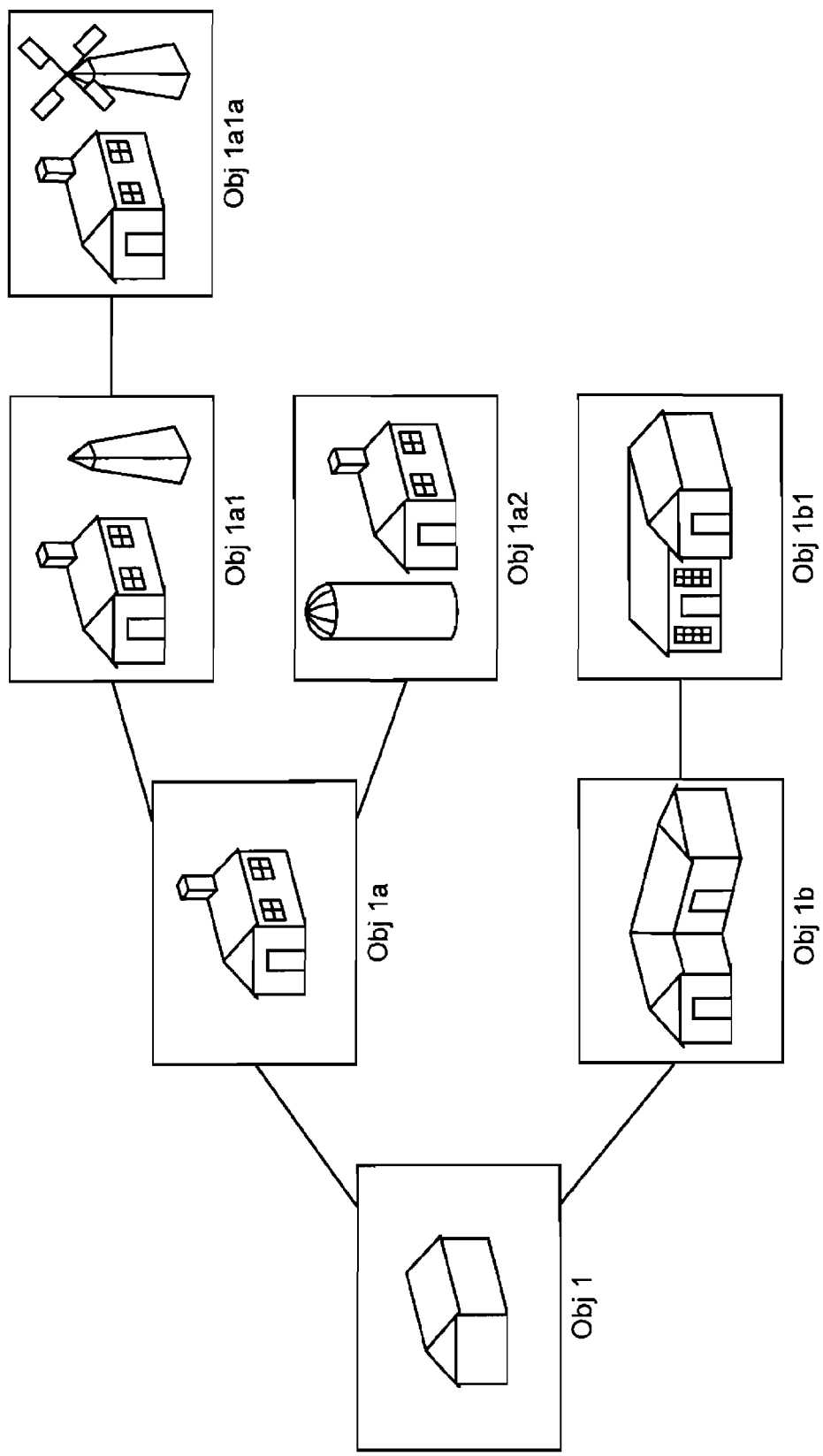
FIG. 3 shows relationships that may be formed between versions of a model for a geographic information system.

FIG. 3 shows relationships that may be formed between versions of a model for a geographic information system. In particular, where models are available for access as described above, users may search for and obtain models of interest and download them in a manner that allows for further editing of the models. In the figure, the exemplary model is a simple model of a farmhouse.

Modifications of the model by various users are shown hierarchically in the figure. The so-called "root" model is Obj1. It is a very basic massing model of single-room house, containing no details. At Obj1*a*, another user has accessed the model and added details (e.g., windows, a door, and a chimney) but has left the massing alone. At Obj1*b*, another user has accessed the model, added a new mass, and added two doors. A further user has accessed Obj1*b*, reversed the massing, and added windows, to create Obj1*b*1. Obj1*a* has been amended at Obj1*a*1 (which has further been altered at Obj1*a*1*a*) and Obj1*a*2.

These representations of various revisions on a model show changes that various users may make when basic models are posted publicly and made available for further alternation. When a user accesses or downloads a model, a system may create a flag indicating the model and the user. The user may then return the model after making additions or other alterations to it, and the flag may be used to connect the newly submitted model to the base model that the user originally accessed. In this manner, logical connections may be formed between various versions of a model so as to permit ready access to a particular model or a particular version of the model.

The models and the relationships between and among the models may be displayed graphically to a user in a manner similar to that shown in FIG. 3. As such, when a user navigates to a certain geography, the user may be presented with a number of different objects in the area. Objects that are placed in the same point or in overlapping areas may be considered, in certain situations, to be models of the same object. For example, various users may have created their own renditions of the Statue of Liberty. A user may select the particular object and be presented with images of each of the models, which may be "root" level versions of a model. Where multiple versions of a model exist, those versions may be shown in a manner like that in FIG. 3 once a user selects that particular model to retrieve. The user may then be given a choice to select a particular version of the model. For example, perhaps the root version is overly simplified for the user's tastes. Or perhaps the root version shows an actual structure, whereas the user wishes to view a fanciful extension of the model, such as a Statue of Liberty having the form of Larry King.

Figure 4:
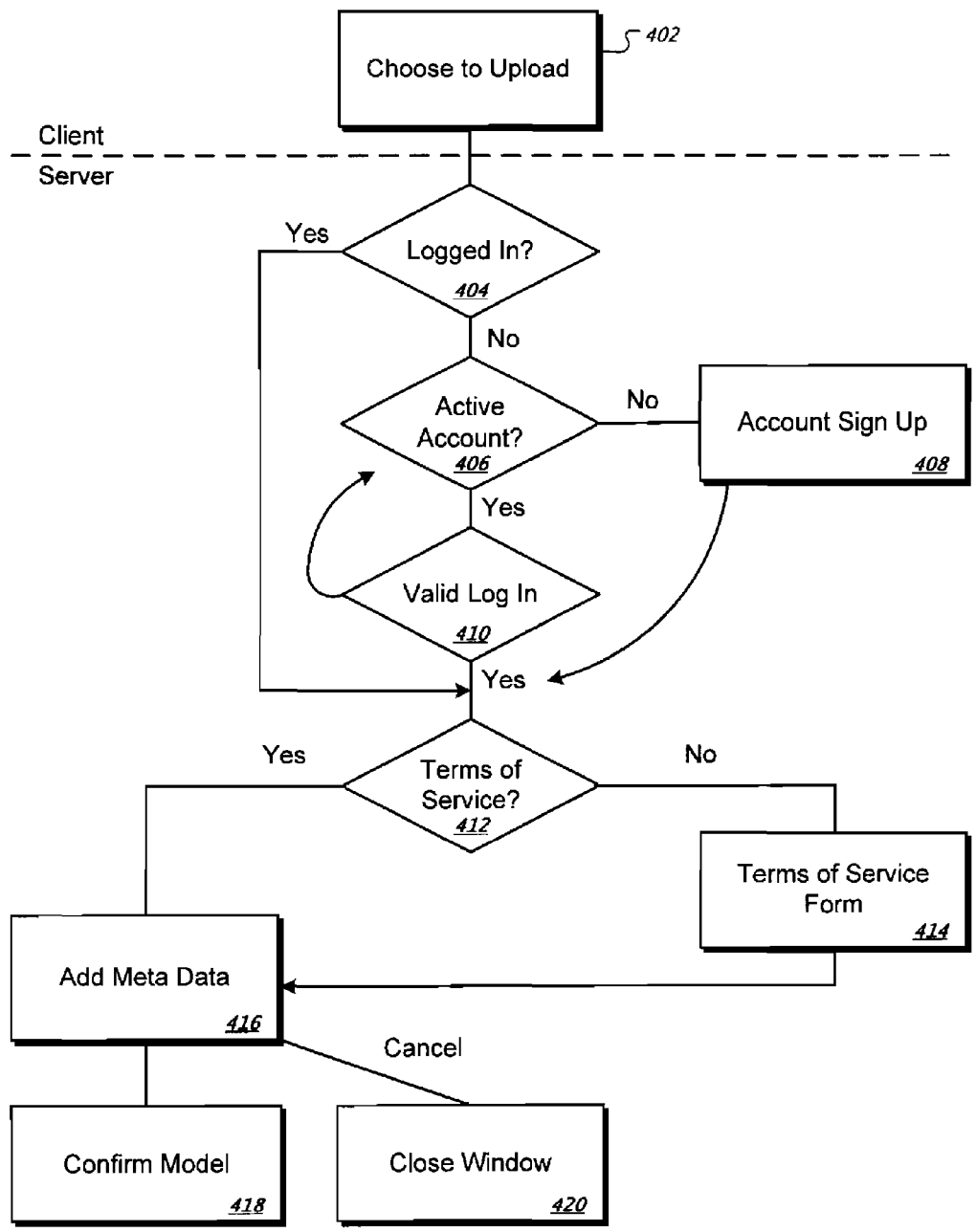
FIG. 4 is a flowchart for uploading objects to a geo-coded database.

FIG. 4 is a flowchart for uploading objects to a geo-coded database. At act 402, a user of a client device (or an application running on the client device) determines that an object may be uploaded to a geographic information system. For example, the user may have constructed a model of a building in a program such as SketchUp, and may determine that they would like to have the model be accessible to others in part of a map or other geographic representation.

At act 404, a server determines whether the user is currently logged into a system. For example, a user may be permitted a single log in during one computing session, and may use that log in to access a number of applications provided in combination with the server, such as e-mail, text messaging, and other applications. As used here, the server may be a single machine or multiple computing devices organized in a manner so as to carry out a number of functions associated with the system.

If the user is not determined to be currently logged in, such as by checking an identifier sent with the upload request by the user, the system may check to determine whether the user has an active account with the system (act 406). If not, the user may go through a process for activating a new account (act 408) and it may then be determined whether the user has agreed to terms of service for the system and/or the particular application (act 412). If the user has a valid account (act 406), then it is determined whether the user has a valid log in, e.g., the user's credentials may be checked by prompting the user for a UserID and a password (act 410).

When a user has been authenticated by whatever means, the system may check to see if the user has yet agreed to the terms of service for uploading objects. If the user has not yet accepted the terms of service, he or she may be presented with a terms of service form (act 414). For example, the user may be reminded that any content they upload can be viewed, used, and modified by other users without any intellectual property violations by the system or by others. Also, the user may be provided with a notice that the uploaded content will be subject to a Creative Commons license, for use by other users. The form may require acceptance by the user before the user may go any farther, and may additionally require an active acceptance, such as by blanking an acceptance box and requiring the user to check the box before continuing. Agreement to the terms of service may be made mandatory for uploading models, but not for viewing models.

At act 416, the user is asked to add meta data relating to their object. For example, a user may provide a URL that points to the model on their computing device so that, for example, the system may redirect other users there or may obtain the object from that location for storage on the system's servers. The user may also provide an image of the object for later display to other users. In addition, the user may identify other users or classes of users who may have access to the model, and may define levels of permissible access. For example, a user may identify an object as "read only" or "view only" so that others may not edit it. The system may place restrictions on the ability of users to place such restrictions, however, as narrow sharing of designs does not encourage later user interaction.

In addition, a user may identify a password and private identifier for an object. In this manner, the user may make the object available only to a select group of other users. For example, an architect may want to prepare a model for review only by a client, but place the model in its proper location within a city. The architect may also accompany the model with a number of mere massing, gray models of other buildings around the design, so that the proposed design is a centerpiece, but can be reviewed in its proper context by clients. However, the architect may not want the public to see the model yet, and may thus password-protect access to the model. Either through the server, or otherwise, the architect may identify e-mail addresses of the users who the architect would like to see the model, and may have invitations delivered to those users. The invitations may include a URL that when selected by the users, causes an application to launch or download for displaying the model in its proper geography. Passwords may be sent separately to the users. To encourage more public use of the system, the use of password protected models may be limited by charging for such use, and making public use free. Alternatively, users of password-protected models may be required to review additional paid promotional material over-and-above what other users would have to view.

At act 418, the server confirms that a model or other object has been properly uploaded or linked to the system. Although such feedback may be given immediately, the availability of the object in the system may occur at a later time. In contrast, if the user cancels out of the process, the server or client may cause a user's window to be closed without finishing the transaction.

Uploads may be sent to a Java (GSE) frontend, which may do simple validation on KML coming from model-makers to check that it is syntactically correct and extract its bounding box. Assuming that the file is valid, the frontend will write the KML file, SKP file, bounding box, and any associated keywords to a single row in a bigtable, which is a system for managing large amounts of data distributed across many machines.

A C++ backend server may periodically scan the bigtable and build up an in-memory index that can be used for keyword and bounding-box searches. The frontend can send RPC search queries to the backend, and the backend may return search results that the frontend will then display. This backend may also serve VBR queries, and return KML placemarks for all models inside a query bounding box. When a user requests a model by clicking on the URL in the placemark, the request may be sent to the frontend server, so that all bandwidth-intensive requests go to the same place.

Various messages may be shared between the front-end and the back-end, including messages relating to metadata associated with each entry (e.g., title, description, author userId, etc.), the popularity of an entry (e.g., tracks number of clicks and download over the past seven days), parameters sent by the frontend for querying a model, messages that associate a metadata with its row name in the bigtable as well as its popularity, a message returned by the backend for queries by lat/long that indicates that many objects are available under an area which would be available at a higher zoom level, messages sent by the front-end to notify the back-end of new/modified data, messages sent by the front-end to update popularity of a list of items, and response messages for queries or index updates.

The front-end may be provided with a number of Java servlets, such as servlets permitting keyword-based search; a servlet to return details on a particular model; a servlet for uploading, such as to validate the content, and if successful, write it to bigtable; a page where the user fills in the details on the model being submitted; a download servlet that retrieves a KML file from the bigtable and returns it; a servlet to delete a model; a servlet to serve cached model thumbnails; and a servlet to manage a terms of service page. The upload functionality may also be part of a model design program, such as SketchUp, itself, and may be provided as a menu option in such an application.

Uploaded models may be written to the bigtable after verification and bounds extraction. The number of polygons in each model may also be counted and stored as meta data. For each new model, the front-end may compute a unique rowname (see below) and create the metadata to store in the bigtable's first column. The other two columns may contain the KMZ and SKP files. The row name for each new model may be computed as follows:

- a random 8-byte number XOR'ed with the current time in milliseconds, represented on 8 bytes as well (using System.currentTimeMillis( ))
- The hash value (8 bytes) of the string representation of the model's metadata, concatenated with the requestor's IP address.
- Both 8 byte numbers written as a hex string using Integer.toHexString( ) and concatenated to produce a 32-character identifier.

Note that the row name may contain no information related to the geographic position of the model. Location of the model can be deduced from its computed bounding box, which is present in the model metadata. Once the row name is computed, the model metadata, KMZ file and SKP files may be written to the bigtable (which may be a very large database table) in the appropriate columns (metatada, kmz and skp).

From in an application such as SketchUp, a user may first choose to upload a model, and the application may then launch a web dialog with a simple request URI (no parameters or post data). Once the user is authenticated, a submit page may be displayed to permit entry of a title, description, comma-separated tags, and browsing for an optional user-created image of the model.

When the user submits the necessary information, they may then click to submit the model. The submit button may point to URL 'skp:upload@/submit', where '/submit' is an actual upload URI. The application may intercept the submission, package up the files (e.g., into a zip containing .skp, .kml, thumbnail.jpg, optional user-created image) into a single POST, and submit it to the upload URI in the same browser session. The request URI may take the form of:

/upload?title=[ . . . ]&description=[ . . . ]&tags= [ . . . ]&bbox=[W,S,E,N,low,high]&polygons=[ . . . ]

The server may then respond with a success or a failure page, depending on what happened during upload.

Updates to an Existing Model

Optionally, clients (such as Sketchup) can identify the model being uploaded with its id (bigtable rowname) in order to submit updates to existing models. Assuming the user trying to update a model is also the model's author, the upload info page will be prepopulated with the metadata for the existing model. An application may extract the ID of a model by querying the value of a hidden input field in the web page presented when the model is uploaded, and store that id in the model itself after a successful upload.

The web interface also has links to allow a model's author to edit the model's metadata from the web interface (useful to correct errors like typos, or entering better tags to categorize models). Models may be made available to users looking at a certain geography, or may alternatively be presented as a result to a search, such as a text search. The search may be a traditional keyword-based search, or may be user-based searches looking for models by a particular user. Searching may also look for tags that identify features relating to models. The front-end may also supports searching for the most recently uploaded and most popular models.

Users may be allowed to flag items as bad or offensive by clicking on a "Report bad item" link located next to each model in a results and details page. That link will redirect (using a URL that encodes information that allows identification of the model) the user to a page that permits entry of particular data by the user for identifying why the model may be offensive.

A model's author may delete their own models from the system. So-called "deleted" models may initially be hidden but not immediately deleted from the bigtable. In this manner, users may be provided with a link to their hidden models, and be given the opportunity to reactivate them.

The backend may periodically scan the keywords in the bigtable and build an in-memory index to answer searches. Ranking may use popularity (user downloads). The front-end can keep popularity counts updated in the bigtable, and the indexer can periodically rescan the table to update its knowledge of the counts.

Shape Indexing: Users may also be permitted to search for particular shapes. For example, a model may be viewed as consisting of a number of "primitive" shapes such as spheres, 3D rectangles, toroids, and the like, and models may be composed of Boolean combinations of these primitives. A model may be associated with one or more shapes, such as by assigning a score for particular shapes to the model, by, for example, how many times a particular shape occurs in a model, and how prominent (e.g., in terms of size) the shapes are when they appear. Also, shapes may be classified by the number of parallel surfaces they have, with spare shapes characterized by straight lines/surfaces, and parallel lines/surfaces—and ornamented designs characterized by more complex surfaces.

Each row in the bigtable may contain the data for one model. Row names may be hashes of various parameters of the model, and need not have inherent meaning. Metadata may be stored separately from other model data so that metadata scans avoid loading the large binary data.

For the object submission, a client such as the SketchUp Client may display an embedded web browser, and points it to a URL for an Upload Metadata page on a server hosting a 3D object database. On this page, a user may enter metadata to be attached to the uploaded model. Such metadata fields may include:

title
description (free-form text)
URL (user-supplied URL where more details can be found about the uploaded model)
tags (list of words/phrases that can be used to categorize the model)

Additionally, if the model is geo-located, then the request URL may contain a request parameter that signifies this. In this case, the 3D object server may add the following fields to the upload metadata page:

physical address (actual location of the physical structure the model represents)
model type (e.g., "real," "fantasy," "planned")

In one implementation, the upload metadata page may contains an Upload button that points to a URL of the form "skp:upload@<UPLOAD-URL>," where <UPLOAD-URL> is the actual URL to which the model should be posted. When the user clicks the Upload button, the client may intercepts the "skp:" URL and (1) if the model is geo-located, export it to KMZ (the format readable by Google Earth); (2) generate a preview image for the file, in JPEG format; (3) create a Zip archive containing the current SketchUp-format model, the preview image, and the exported KMZ (the latter only for geo-located models); (4) send the Zip archive to the <UPLOAD-URL> via HTTP POST, with the names/values of the metadata fields added to the URL as query parameters; and (5) the 3D database server may receive the POST, extract the Zip archive, and store all of the submitted files and metadata.

In another implementation, the upload metadata page may allow a user to submit all of the fields mentioned above by pressing an Upload button. If the values are invalid in any way, the upload metadata page may be presented again with errors highlighted. If the metadata values are accepted, the following actions may occur:

The 3D database server stores the metadata values and generates a Unique ID that can be used to look them up.
The 3D database server sends a browser redirect to the client. The redirect URL is of the form "skp: upload@<UPLOAD-URL>," where <UPLOAD-URL> is the actual URL to which the model should be posted. The URL contains the metadata's Unique ID as a query parameter. The Client intercepts the "skp:" URL and does the following: (1) if the model is geo-located, exports it to KMZ (the format readable by Google Earth); (2) generates a preview image for the file, in JPEG format; (3) creates a Zip archive containing the current SketchUp-format model, the preview image, and the exported KMZ (the latter only for geo-located models); (4) sends the Zip archive to the <UPLOAD-URL> via HTTP POST; and (5) the 3D database server receives the POST, extracts the Zip archive, and stores all the extracted files, associated with the originally-submitted metadata using the Unique ID in the <UPLOAD-URL>.

Models can be located and obtained by the 3D database server, using the Get Models feature in a SketchUp Client. The SketchUp Client may display an embedded web browser that points to a Search URL on a 3D database server. Models stored on the server may be presented to the user in a standard search/results/details manner.

Each model detail page may also contain a DownLoad to SketchUp button. The URL for this button may be of the form "skp:download@<DOWNLOAD-URL>," where <DOWN-LOAD-URL> is the actual URL from which the SketchUp model can be obtained. When the button is clicked, the following may occur:

The client intercepts the "skp:" URL and displays a dialog asking whether or not to download directly into the current document. If the answer is No, the embedded web browser itself may be redirected to the <DOWN-LOAD-URL>, and a standard browser download may take place. If the answer is Yes, then the client may make an HTTP request to download the model. It may store the downloaded model in memory and load it directly into the current design document.

If the model was downloaded directly into the current document, there may be several behaviors that depend on whether the model is geo-located:

If the model is not geo-located, then it may be pushed onto a tool that allows the user to choose the 3D location of the model graphically.

If the downloaded model is geospecific, then:

If the_current_model is geospecific, then the user is prompted to either put the downloaded model in its "natural" place relative to the current one, or to place it manually using the Place Component tool.

Otherwise, then the downloaded model's geo-location information is transferred to the current model (making it geo-located).

Figure 5:
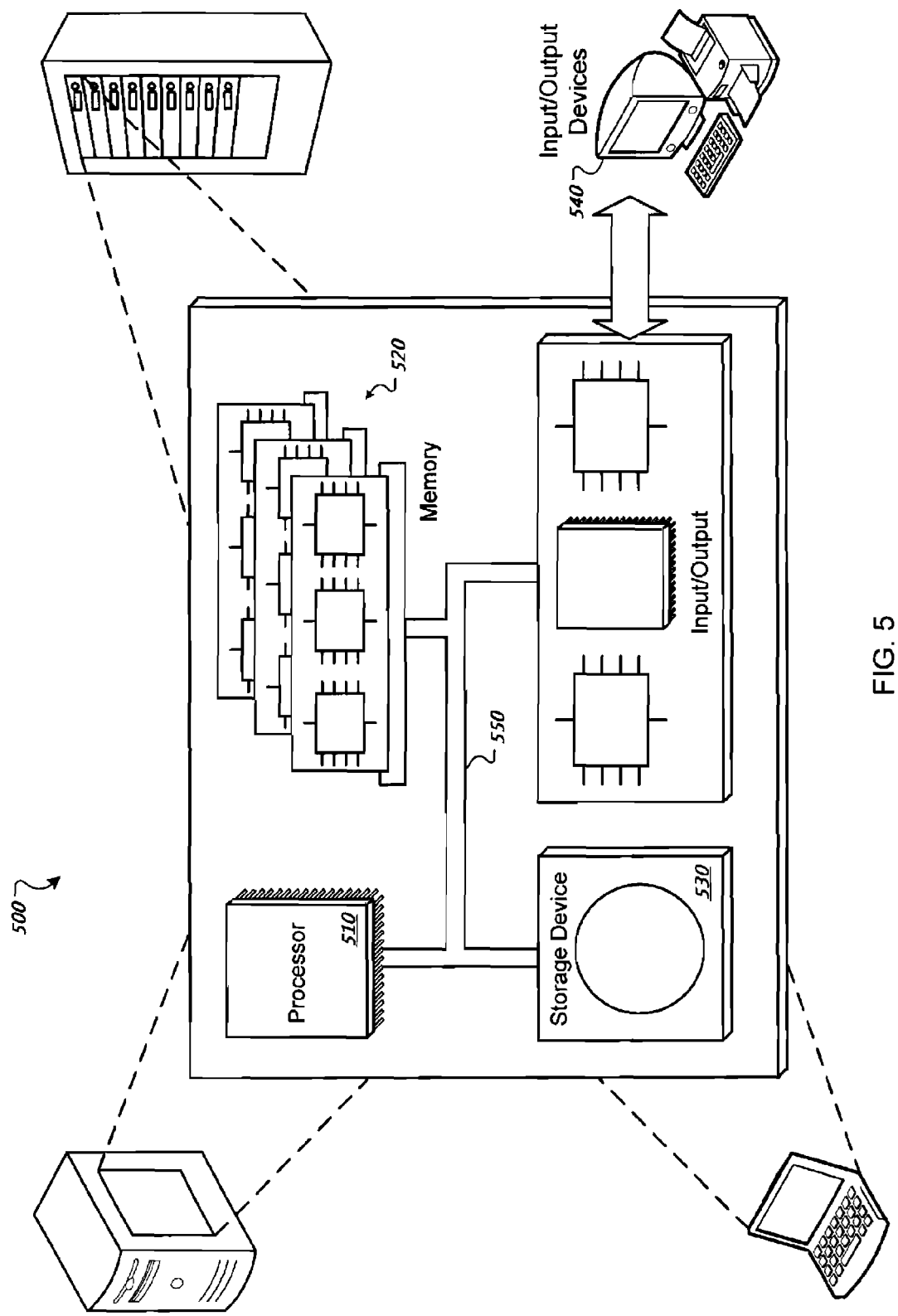
FIG. 5 is a schematic diagram showing components in a computer system suitable to be used with the systems and methods described in this document.

FIG. 5 is a schematic diagram showing components in a computer system suitable to be used with the systems and methods described in this document. The system 500 includes a processor 510, a memory 520, a storage device 530, and an input/output device 540. Each of the components 510, 520, 530, and 540 are interconnected using a system bus 550. The processor 510 is capable of processing instructions for execution within the system 2300. In one implementation, the processor 510 is a single-threaded processor. In another implementation, the processor 510 is a multi-threaded processor. The processor 510 is capable of processing instructions stored in the memory 520 or on the storage device 530 to display graphical information for a user interface on the input/output device 540.

The memory 520 stores information within the system 500. In one implementation, the memory 520 is a computer-readable medium. In one implementation, the memory 520 is a volatile memory unit. In another implementation, the memory 520 is a non-volatile memory unit.

The storage device 530 is capable of providing mass storage for the system 500. In one implementation, the storage device 530 is a computer-readable medium. In various different implementations, the storage device 530 may be a floppy disk device, a hard disk device, an optical disk device, or a tape device.

The input/output device 540 provides input/output operations for the system 500. In one implementation, the input/output device 540 includes a keyboard and/or pointing device. In another implementation, the input/output device 540 includes a display unit for displaying graphical user interfaces.

The features described can be implemented in digital electronic circuitry, or in computer hardware, firmware, software, or in combinations of them. The apparatus can be implemented in a computer program product tangibly embodied in an information carrier, e.g., in a machine-readable storage device or in a propagated signal, for execution by a programmable processor; and method steps can be performed by a programmable processor executing a program of instructions to perform functions of the described implementations by operating on input data and generating output. The described features can be implemented advantageously in one or more computer programs that are executable on a programmable system including at least one programmable processor coupled to receive data and instructions from, and to transmit data and instructions to, a data storage system, at least one input device, and at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

The features can be implemented in a computer system that includes a back-end component, such as a data server, or that includes a middleware component, such as an application server or an Internet server, or that includes a front-end component, such as a client computer having a graphical user interface or an Internet browser, or any combination of them. The components of the system can be connected by any form or medium of digital data communication such as a communication network. Examples of communication networks include, e.g., a LAN, a WAN, and the computers and networks forming the Internet.

The computer system can include clients and servers. A client and server are generally remote from each other and typically interact through a network, such as the described one. The relationship of client and server arises by virtue of computer programs running on the respective computers and having a client-server relationship to each other.

A number of embodiments have been described. Nevertheless, it will be understood that various modifications may be made without departing from the spirit and scope of what is described. Accordingly, other embodiments are within the scope of the following claims.

What is claimed is:

1. A method performed by a server comprising one or more computing devices, comprising:
   receiving, at the server through an Internet-accessible interface, information identifying a three-dimensional model from a submitter;
   receiving, at the server, information identifying a geographical location of the three-dimensional model from the submitter, the geographical location geo-locating the three-dimensional model on a geography;
   storing, using the server, the geo-located three-dimensional model in a model database with a plurality of other geo-located models; and
   forming, using the server, an association between image information representing the geographical location and the geo-located three-dimensional model, wherein the association locates the geo-located three-dimensional model in context within and overlaid on a representation of the geographical location.

2. The method of claim 1, further comprising:
   receiving, at the server, a request submitted by a client device, the request including information identifying the geographical location; and
   causing, using the server, image information representing the geographical location in association with the geo-located three-dimensional model to be delivered to the client device that submitted the request.

3. The method of claim 1, wherein the information identifying the three-dimensional model comprises information defining the three-dimensional model in association with the geographical location and is transmitted in an XML format.

4. The method of claim 1, wherein the information identifying the geographical location of the three-dimensional model includes a placemark that identifies the location of the information defining the three-dimensional model and a link directed to the information defining the three-dimensional model, wherein selection of the link causes the three-dimensional model to be downloaded to a requesting client device.

5. The method of claim 4, further comprising storing and transmitting an image of the three-dimensional model using the server, wherein the image is formatted so that selection of the image by a user causes the three-dimensional model to be displayed on the requesting client device.

6. The method of claim 1, further comprising associating, using the server, advertising with the geo-located three-dimensional model for display on the three-dimensional geo-located model.

* * * * *